United States Patent
Jung (10) Patent No.: US 6,996,012 B2
(45) Date of Patent: Feb. 7, 2006

(54) NONVOLATILE MEMORY DEVICE CAPABLE OF PREVENTING OVER-ERASURE VIA MODIFIED TUNNELING THROUGH A DOUBLE OXIDE LAYER BETWEEN A FLOATING GATE AND A CONTROL GATE

(75) Inventor: Jin Hyo Jung, Kyunggido (KR)

(73) Assignee: DongbuAnam Semiconductor Inc., Seoul (KR)

(*) Notice: Subject to any disclaimer, the term of this patent is extended or adjusted under 35 U.S.C. 154(b) by 0 days.

(21) Appl. No.: 11/024,197

(22) Filed: Dec. 29, 2004

(65) Prior Publication Data

US 2005/0162914 A1    Jul. 28, 2005

(30) Foreign Application Priority Data

Dec. 31, 2003  (KR)  ........................ 10-2003-0101718
Dec. 31, 2003  (KR)  ........................ 10-2003-0101848

(51) Int. Cl.
*G11C 16/34*    (2006.01)

(52) U.S. Cl. ........................... 365/185.3; 365/185.29; 365/185.28; 365/185.26; 365/185.02; 365/185.2; 365/185.18; 365/185.03

(58) Field of Classification Search .............. 365/185.3, 365/185.29, 185.28, 185.26, 185.02, 185.2, 365/185.18, 185.03, 185.23
See application file for complete search history.

(56) References Cited

U.S. PATENT DOCUMENTS 5,455,793 A * 10/1995 Amin et al. ........... 365/185.26
6,413,819 B1 * 7/2002 Zafar et al. .................. 438/257

* cited by examiner

*Primary Examiner*—Andrew Q. Tran
(74) *Attorney, Agent, or Firm*—Finnegan, Henderson, Farabow, Garrett & Dunner, L.L.P.

(57) ABSTRACT

A non-volatile memory device and a method for driving the same prevent an excessive electron erasing phenomenon without additional components. Each memory cell includes a tunnel oxide layer, a floating gate, a control gate connected to a word line, first and second oxide layers formed between the floating gate and the control gate, and first and second impurity diffusion layers formed in a semiconductor substrate at both sides of the floating gate and connected to a common line and a bit line.

22 Claims, 7 Drawing Sheets

|  | Programming | Erasing1 | Erasing2 | reading |
|---|---|---|---|---|
| WL1 | 0 | −Vwle | −Vwe | 0 |
| WL2 | Vwlp | −Vwle | −Vwe | Vref |
| WL3 | 0 | −Vwle | −Vwe | 0 |
| WL4 | 0 | −Vwle | −Vwe | 0 |
| BL1 | 0 | floating | floating | 0 |
| BL2 | 0 | floating | floating | 0 |
| BL3 | Vblp | floating | floating | Vbir |
| BL4 | 0 | floating | floating | 0 |
| Common line | 0 | 0(Vb) | 0(Vs) | 0 |
| substrate | 0 | 0(Vb) | floating | 0 |

|  | Erasing1 | Erasing2 | Programming | reading |
|---|---|---|---|---|
| CG1 | -Ve | -Ve | Vp | Vref |
| CG2 | -Ve | -Ve | Vp | Vref |
| CG3 | -Ve | -Ve | Vp | Vref |
| CG4 | -Ve | -Ve | Vp | Vref |
| WL1 | F | F | 0 | 0 |
| WL2 | F | F | Vwlp | Vwlr |
| WL3 | F | F | 0 | 0 |
| WL4 | F | F | 0 | 0 |
| BL1 | F | F | 0 | 0 |
| BL2 | F | F | 0 | 0 |
| BL3 | F | F | Vblp | Wbir |
| BL4 | F | F | 0 | 0 |
| Common line | F | 0(Vs) | 0 | 0 |
| substrate | 0(Vb) | F | 0 | 0 |

FIG. 9

NONVOLATILE MEMORY DEVICE CAPABLE OF PREVENTING OVER-ERASURE VIA MODIFIED TUNNELING THROUGH A DOUBLE OXIDE LAYER BETWEEN A FLOATING GATE AND A CONTROL GATE

CROSS-REFERENCE TO RELATED APPLICATIONS

The present invention claims the benefit of Korean Application Nos. P2003-0101848 and P2003-0101718 filed on Dec. 31, 2003, which is hereby incorporated by reference as if fully set forth herein.

BACKGROUND OF THE INVENTION

1. Field of the Invention

The present invention relates to a non-volatile memory device, and more particularly, to a non-volatile memory device to prevent an excessive electron erasing phenomenon without providing additional components, and a method for driving a non-volatile memory device by an erasing bias-condition, a programming-bias condition and a reading bias-condition.

2. Discussion of the Related Art

Recently, as demands for non-volatile memories, for example, flash memories, which can electrically program or erase data increase sharply, geometries of structures of the non-volatile memory undergo many changes.

Figure 1:
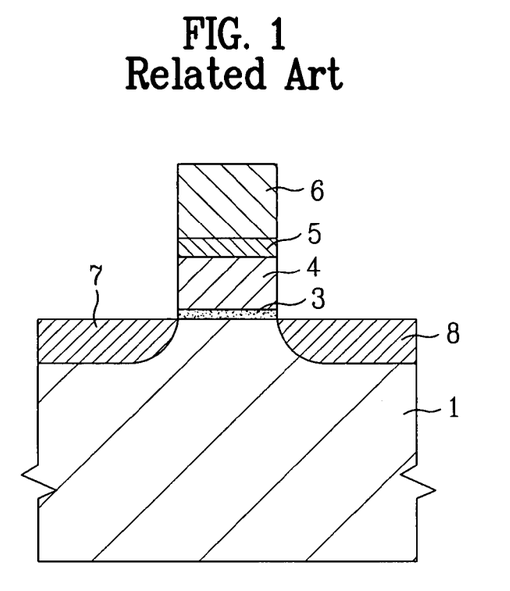
FIG. 1 is a cross sectional view of a unit memory cell in a non-volatile memory device according to the related art.
Figure 2:
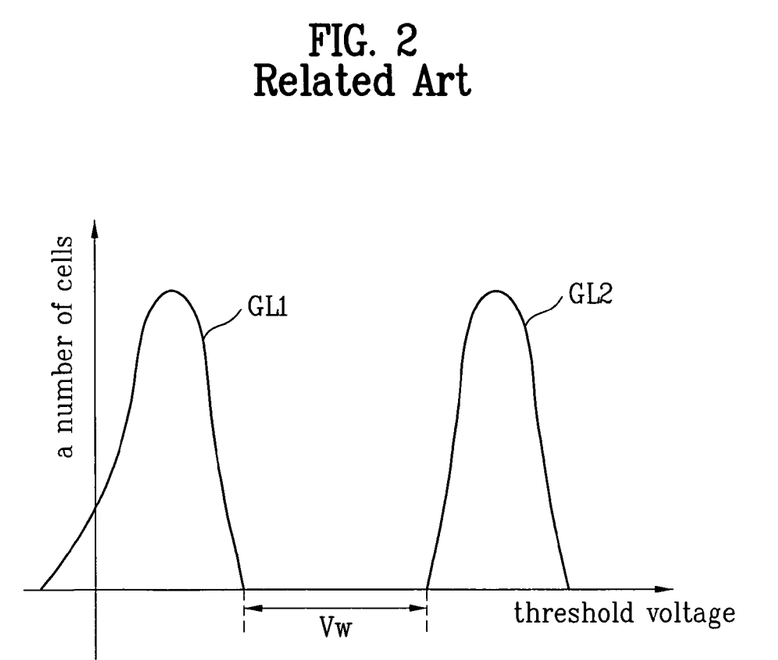
FIG. 2 is a graph for showing an erasing threshold voltage distribution curve and a programming threshold voltage distribution curve in a non-volatile memory device according to the related art.

FIG. 1 is a cross sectional view of a unit memory cell in a non-volatile memory device according to the related art. FIG. 2 is a graph of an erasing threshold voltage and a programming threshold voltage in a non-volatile memory device according to the related art.

As shown in FIG. 1, the unit memory cell of the non-volatile memory device according to the related art includes a tunnel oxide layer pattern 3, a floating gate pattern 4, an ONO (Oxide-Nitride-Oxide) pattern 5, a control gate pattern 6, and source/drain diffusion layers 7/8. At this time, the tunnel oxide layer pattern 3 is formed on an active area of a semiconductor substrate 1, and the floating gate pattern 4 is formed on the tunnel oxide layer pattern 3. Then, the ONO pattern 5 is formed on the floating gate pattern 4, and the control gate pattern 6 is formed on the ONO pattern 5. Also, the source/drain diffusion layers 7/8 are formed in the semiconductor substrate 1 at both sides of the floating gate pattern 4.

The non-volatile memory device according to the related art is comprised of the plurality of memory cells, and a plurality of signal lines for driving the unit memory cells.

In the non-volatile memory device according to the related art, a programming operation and an erasing operation are performed by a logic circuit. That is, in case of the programming operation, electrons leap over an energy barrier of the tunnel oxide layer pattern 3 by a hot carrier injection process, and then the electrons are injected to a potential well of the floating gate pattern 4. In case of the erasing operation, the electrons stored in the potential well of the floating gate pattern 4 are discharged to the semiconductor substrate 11 by F-N tunneling the tunnel oxide layer pattern 3. Accordingly, on performing the programming operation, a threshold voltage of the memory cell increases due to the injection of electrons. Meanwhile, on performing the erasing operation, the threshold voltage of the memory cell decreases.

Thus, since the threshold voltage of the memory cell is varied dependent on the programming operation or the erasing operation, the logic circuit applies a reading voltage to the control gate pattern 6, to determine whether the memory cell is in the program state or the erasing state.

However, the non-volatile memory device according to the related art has the following disadvantages.

First, the non-volatile memory device according to the related art has the complex structure due to the change in size of the active area, the change in thickness of the tunnel oxide layer pattern 3, the change on overlapped area between the source/drain diffusion layers 7/8 and the floating gate pattern 4, the change in size of the floating gate pattern 4, the roughness in surface of the floating gate pattern 4, the change in thickness of the ONO pattern 5, and the damage of the tunnel oxide layer pattern 3. Accordingly, if the erasing operation is performed without the additional process, some of the memory cells may have troubles in that the electrons injected to the floating gate pattern 4 on the programming operation are considerably discharged to the external. That is, as shown in FIG. 2, the threshold voltage of the memory cell is below 0V, thereby causing the trouble of excessively erasing the electrons. Eventually, as shown in the drawing, a wide erasing threshold voltage distribution curve GL1 is formed.

In state that the excessive electron-erasing phenomenon generates, if the additional process is not performed, it is impossible for the logic circuit to read data in another memory cell of a bit line.

Furthermore, the excessive electron-erasing phenomenon has bad effects on the programming operation. In this state, if the additional process for preventing the excessive electron-erasing phenomenon is not performed, a programming threshold voltage distribution curve GL2 also is as wide as the erasing threshold voltage distribution curve GL1. Thus, since a threshold voltage window VW is formed between the programming threshold voltage distribution curve GL2 of the memory cell and the erasing threshold voltage distribution curve GL1 of the memory cell, the threshold voltage window VW decreases largely.

As the threshold voltage window VW formed between the programming threshold voltage distribution curve GL2 and the erasing threshold voltage distribution curve GL1 decreases largely, there are many troubles in setting the plurality of reading voltages for the logic circuit. Accordingly, the memory cell is used for only memory device of storing 1-bit level.

To overcome the excessive electron-erasing phenomenon, it is necessary for the logic circuit to provide an additional complex circuit of re-programming the memory cells from which the electrons are excessively erased. Thus, the non-volatile memory device according to the related art requires the additional complex circuit, thereby lowering the production efficiency of the non-volatile memory device, and increasing the size of non-volatile memory device.

SUMMARY OF THE INVENTION

Accordingly, the present invention is directed to a method for driving a non-volatile memory device that substantially obviates one or more problems due to limitations and disadvantages of the related art.

An object of the present invention is to provide a method for driving a non-volatile memory device, to prevent an excessive electron-erasing phenomenon and to realize stability and reliability in driving the non-volatile memory device without additional components for a logic circuit.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for driving a non-volatile memory device including a plurality of word lines, a plurality of bit lines, and a plurality of memory cell, wherein each memory cell includes a tunnel oxide layer, a floating gate pattern, a control gate pattern connected with the word line, first and second block oxide layers formed between the floating gate pattern and the control gate pattern, and first and second impurity diffusion layers formed in a semiconductor substrate at both sides of the floating gate pattern and connected with a common line and the bit line, includes steps of floating the bit lines and the common line, applying a negative (−) voltage to the word lines, and applying a first voltage to the semiconductor substrate, to erase electrons injected to the floating gate patterns to the semiconductor substrate, and to induce some of electrons stored in the control gate patterns to the floating gate patterns by modified tunneling; applying a positive (+) voltage to the word line and the bit line of the selected memory cell, and applying a second voltage to the remaining word lines and bit lines, the common line and the semiconductor substrate, to program the electrons in the selected memory cell; and applying a reference voltage to the word line of the selected memory cell, applying a positive voltage to the bit line of the selected memory cell, and applying a second voltage to the remaining word lines and bit lines, the common line and the semiconductor substrate, to read a program state of the selected memory cell.

In another aspect, a method for driving a non-volatile memory device including a plurality of word lines, a plurality of bit lines, and a plurality of memory cell, wherein each memory cell includes a tunnel oxide layer, a floating gate pattern, a control gate pattern connected with the word line, first and second block oxide layers formed between the floating gate pattern and the control gate pattern, and first and second impurity diffusion layers formed in a semiconductor substrate at both sides of the floating gate pattern and connected with a common line and the bit line, includes steps of floating the bit lines and the semiconductor substrate, applying a negative (−) voltage to the word lines, and applying a first voltage to the common line, to erase electrons injected to the floating gate patterns to the first impurity diffusion layer, and to induce electrons stored in the control gate patterns to the floating gate patterns by modified tunneling; applying a positive (+) voltage to the word line and the bit line of the selected memory cell, and applying a second voltage to the remaining word lines and bit lines, the common line and the semiconductor substrate, to program the electrons in the selected memory cell; and applying a reference voltage to the word line of the selected memory cell, applying a positive voltage to the bit line of the selected memory cell, and applying a second voltage to the remaining word lines and bit lines, the common line and the semiconductor substrate, to read a program state of the selected memory cell.

In another aspect, a method for driving a non-volatile memory device including a plurality of word lines, a plurality of control lines, a plurality of bit lines, a plurality of memory cells, and a plurality of select transistors for selecting the memory cell by the plurality of word lines, wherein each memory cell includes a tunnel oxide layer, a floating gate pattern, a control gate pattern connected with the control line, first and second oxide layers formed between the floating gate pattern and the control gate pattern, and first and second impurity diffusion layers formed in a semiconductor substrate at both sides of the floating gate pattern and connected with a common line and the bit line, includes steps of floating the word lines, the bit lines, and the common line, applying a negative (−) voltage to the control lines, and applying a first voltage to the semiconductor substrate, to erase electrons injected to the floating gate pattern to the semiconductor substrate, and to induce some electrons stored in the control gate patterns to the floating gate patterns by modified tunneling; applying a positive voltage to the word line and the bit line of the selected memory cell, applying a second voltage to the remaining word lines, the bit lines, the common line, and the semiconductor substrate, and applying a positive voltage to the control lines, to program the electrons in the selected memory cell; and applying a reference voltage to the control lines, applying a positive voltage to the word line and the bit line of the selected memory cell, and applying a second voltage to the remaining word lines, the bit lines, the common line and the semiconductor substrate, to read a program state of the selected memory cell.

In another aspect, a method for driving a non-volatile memory device including a plurality of word lines, a plurality of control lines, a plurality of bit lines, a plurality of memory cells, and a plurality of select transistors for selecting the memory cell by the plurality of word lines, wherein each memory cell includes a tunnel oxide layer, a floating gate pattern, a control gate pattern connected with the control line, first and second oxide layers formed between the floating gate pattern and the control gate pattern, and first and second impurity diffusion layers formed in a semiconductor substrate at both sides of the floating gate pattern and connected with a common line and the bit line, comprising: floating the word lines, the bit lines and the semiconductor substrate, applying a negative (−) voltage to the control lines, and applying a first voltage to the common line, to erase electrons injected to the floating gate patterns to the first impurity diffusion layer, and to induce electrons stored in the control gate patterns to the floating gate patterns by modified tunneling; applying a positive (+) voltage to the word line and the bit line of the selected memory cell, applying a second voltage to the remaining word lines and bit lines, the common line and the semiconductor substrate, and applying a positive voltage to the control lines, to program the electrons in the selected memory cell; and applying a reference voltage to the control lines, applying a positive voltage to the word line and the bit line of the selected memory cell, and applying a second voltage to the remaining word lines and bit lines, the common line and the semiconductor substrate, to read a program state of the selected memory cell.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
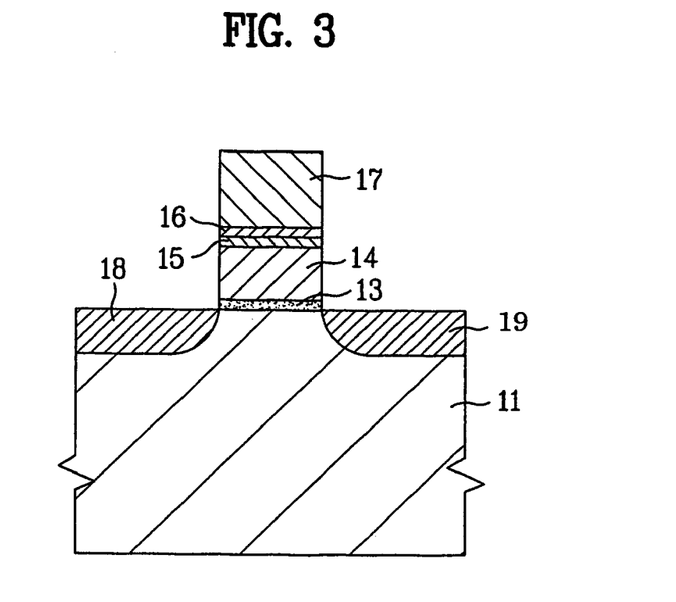
FIG. 3 is a cross sectional view of a unit memory cell in a non-volatile memory device according to the present invention.
Figure 4:
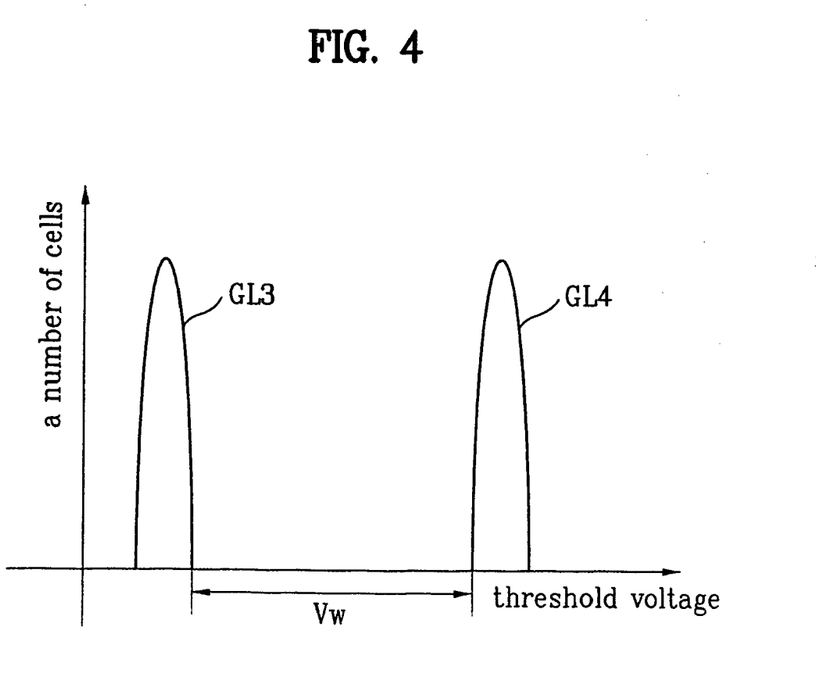
FIG. 4 is a graph for showing an erasing threshold voltage distribution curve and a programming threshold voltage distribution curve in a non-volatile memory device according to the present invention.

FIG. 3 is a cross sectional view of a unit memory cell in a non-volatile memory device according to the present invention. FIG. 4 is a graph for showing an erasing threshold voltage distribution curve and a programming threshold voltage distribution curve in a non-volatile memory device according to the present invention.

As shown in FIG. 3, the unit memory cell of the non-volatile memory device according to the present invention includes a tunnel oxide layer pattern 13, a floating gate pattern 14, a first block oxide layer pattern 15, a second block oxide layer pattern 16, a control gate pattern 17, and source/drain diffusion layers 18/19. At this time, the tunnel oxide layer pattern 13 is formed on an active area of a semiconductor substrate 11, and the floating gate pattern 14 is formed on the tunnel oxide layer pattern 13. Then, the first block oxide layer pattern 15 is formed on the floating gate pattern 14, and the second block oxide layer pattern 16 is formed on the first block oxide layer pattern 15. Also, the control gate pattern 17 is formed on the second block oxide layer pattern 16, and the source/drain diffusion layers 18/19 are formed in the semiconductor substrate 11 at both sides of the floating gate pattern 14.

Herein, the first block oxide layer pattern 15 has a smaller energy band gap than that of the tunnel oxide layer pattern 13, and the second block oxide layer pattern 16 has a larger energy band gap than that of the first block oxide layer pattern 15. For example, the first block oxide layer pattern 15 may be formed of $Al_2O_3$ or $Y_2O_3$, and the second block oxide layer pattern 16 may be formed of $SiO_2$. In this state, if performing an erasing operation, electrons stored in the control gate pattern 17 are induced to the floating gate pattern 14 by modified tunneling at the latter half of the erasing operation. Accordingly, on the erasing operation, even though the electrons stored in the floating gate pattern 14 are considerably discharged to the external, some are compensated with the electrons of the control gate pattern 17, thereby preventing an excessive electron-erasing phenomenon in each memory cell.

As preventing the excessive electron-erasing phenomenon, as shown in FIG. 4, each width of a programming threshold voltage distribution curve GL4 and an erasing threshold voltage distribution curve GL3 decreases largely. Thus, a width of a threshold voltage window VW smoothly increases, whereby each memory cell can easily store a multi-bit level in a logic circuit according to the circumstances.

In case of preventing the excessive electron-erasing phenomenon in each memory cell by compensation of the electrons from the control gate pattern 17, there is no requirement for providing additional circuit components for re-programming, thereby minimizing the size of the non-volatile memory device.

A non-volatile memory device including the plurality of unit memory cells according to the present invention will be described as follows.

Figure 5:
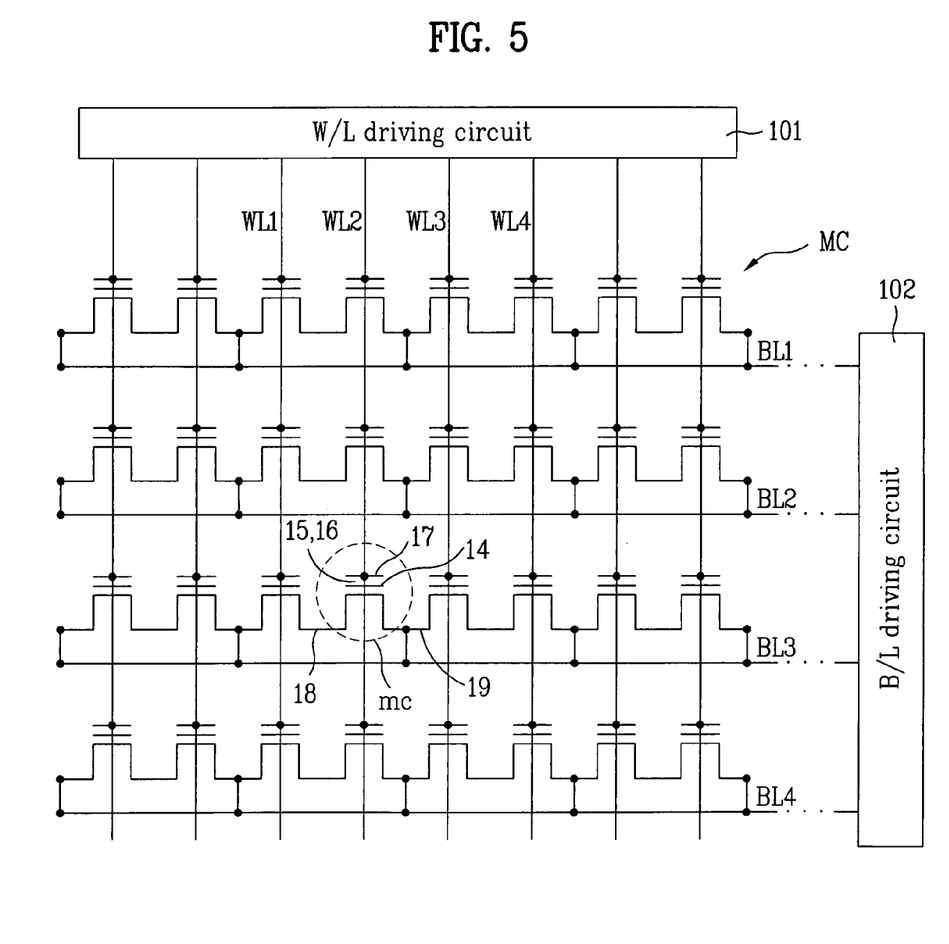
FIG. 5 is a circuit diagram of a non-volatile memory device according to the first embodiment of the present invention.
Figure 6:
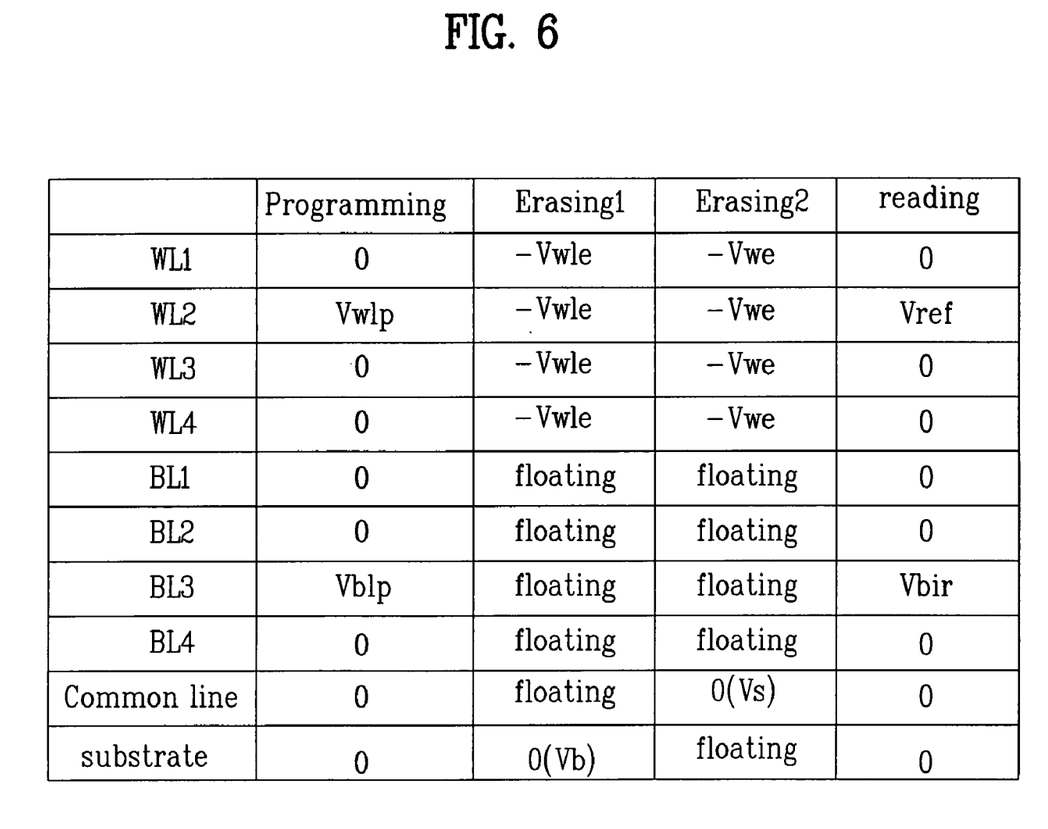
FIG. 6 is a table for showing the driving conditions of a non-volatile memory device according to the first embodiment of the present invention.

FIG. 5 is a circuit diagram of a non-volatile memory device according to the first embodiment of the present invention. FIG. 6 is a table for showing the driving conditions of a non-volatile memory device according to the first embodiment of the present invention.

The non-volatile memory device according to the first embodiment of the present invention includes a plurality of non-volatile memory cells (MC) arranged in a matrix type, a plurality of word lines (WL1, WL2, WL3, ...) and a plurality of bit lines (BL1, BL2, BL3, ...) for selectively driving the non-volatile memory cells (MC), a word line driving circuit 101 for driving the plurality of word lines, a bit line driving circuit 102 for driving the plurality of bit lines, and a common source driving circuit (not shown).

As shown in FIG. 3, each of the memory cells (MC) includes a tunnel oxide layer pattern 13, a floating gate pattern 14, a first block oxide layer pattern 15, a second block oxide layer pattern 16, a control gate pattern 17, and source/drain diffusion layers 18/19. At this time, the tunnel oxide layer pattern 13 is formed on a semiconductor substrate 11, and the floating gate pattern 14 is formed on the tunnel oxide layer pattern 13. Then, the first block oxide layer pattern 15 is formed on the floating gate 14, and the second block oxide layer pattern 16 is formed on the first block oxide layer pattern 15. Also, the control gate pattern 17 is formed on the second block oxide layer pattern 16, and the source/drain diffusion layers 18/19 are formed in the semiconductor substrate 11 at both sides of the floating gate pattern 14.

In addition, the respective control gate patterns 17 of the memory cells (MC) arranged along each vertical line are connected to one word line, and the source/drain diffusion layers 18/19 of the memory cells (MC) arranged along each horizontal line are alternately connected to one bit line and one common line (not shown).

A method for driving the non-volatile memory device according to the first embodiment of the present invention will be described in detail.

First, an erasing method will be described as follows.

To discharge the electrons injected to the floating gate pattern 14 in each memory cell (MC) to the semiconductor substrate 11, as shown in FIG. 6, the bit lines (BL 1, BL2, BL3, BL4) and the common line are floated, a negative (−) voltage is applied to the word lines (WL1, WL2, WL3, WL4), and a ground voltage (0V) or a positive (+) voltage (Vb) is applied to the semiconductor substrate 11.

On applying the voltages, a strong electric field is formed from the semiconductor substrate 11 toward the control gate pattern 17 of the memory cell (MC). As applying the strong electric field, the electrons stored in a potential well of the floating gate pattern 14 are discharged to the semiconductor substrate 11 by F-N tunneling the tunnel oxide layer pattern 13. Thus, the threshold voltage in each memory cell (MC) decreases.

In this state, since the first and second block oxide layer patterns 15 and 16 are positioned between each floating gate pattern 14 and the control gate pattern 17, the electrons of the control gate pattern 17 are induced to the floating gate pattern 14 by modified tunneling at the latter half of the erasing operation. Accordingly, even though the electrons of the floating gate pattern 14 are considerably discharged to the control gate pattern 17, it is compensated with some electrons of the control gate pattern 17, thereby preventing the excessive electron erasing phenomenon in each memory cell (MC).

A programming method for injecting the electrons to the memory cell (MC) for programming will be described as follows.

That is, a positive (+) voltage is applied to the corresponding word line WL2 of the cell for programming, and a ground voltage 0V is applied to the remaining word lines. Then, a positive (+) voltage is applied to the corresponding bit line BL3 of the selected memory cell (MC), and a ground voltage 0V is applied to the remaining bit lines. Also, a ground voltage 0V is applied to the common line and the semiconductor substrate 11.

In the memory cell (MC) selected by the word line WL1 and the bit line BL3 having the positive (+) voltage applied thereto, the voltage is simultaneously applied to the drain diffusion layer 19 and the control gate pattern 17. As a result, a channel is formed between the source diffusion layer 18 and the drain diffusion layer 19 of the selected memory cell (MC), so that a current flows from the drain diffusion layer 19 to the source diffusion layer 18. Then, hot carriers generate at a corner of the flowing gate pattern 14 overlapped with the source diffusion layer 18, and some electrons are injected to the floating gate pattern 14 by hot-electron injection effect. At this time, the voltage applied to the word line WL2 and the bit line BL3 is determined in due consideration of hot-electron injection effect, break-down of the drain diffusion layer 19, flow of current, and diffusion coefficient of electrons.

Meanwhile, in state of completing the programming process under the aforementioned bias-conditions, a reading step is performed to read the programming state of the selected memory cell (MC).

That is, a reference voltage (Vref) is applied to the corresponding word line WL2 of the memory cell (MC) for reading the programmed state, and a ground voltage is applied to the remaining word lines. Then, a positive (+) voltage is applied to the corresponding bit line BL3 of the selected memory cell (MC), and a ground voltage is applied to the common line and the semiconductor substrate 11. Accordingly, the corresponding memory cell (MC) can read the data according to the erasing state or the programming state. That is, as described above, in case of the erasing state, the memory cell (MC) has the low threshold voltage. Meanwhile, in case of the programming state, the memory cell (MC) has the high threshold voltage. Thus, if the reference voltage is applied to the word line of the selected memory cell (MC), on the erasing state of the corresponding memory cell (MC), the channel is formed between the source diffusion layer 18 and the drain diffusion layer 19. However, on the programming state of the corresponding memory cell (MC), the channel is not formed between the source diffusion layer 18 and the drain diffusion layer 19, so that it is possible to read the data storing state in each memory cell (MC) by using the current flow mechanism of the memory cell (MC).

At this time, the reference voltage applied to the word line WL2 of the selected memory cell (MC) is determined as an intermediate value between the highest erasing threshold voltage and the lowest programming threshold voltage in each memory cell (MC).

If the voltage applied to the bit line BL3 of the selected memory cell (MC) is too high, it may cause the unnecessary programming operation in the selected memory cell (MC). In this respect, in case of the present invention, there is requirement for controlling the appropriate intensity of voltage applied to the bit line BL3 of the selected memory cell (MC).

As described above, on the erasing process, the electrons injected to the floating gate pattern 14 are discharged to the semiconductor substrate 11. However, the electrons injected to the floating gate pattern 14 may be discharged to the source diffusion layer 18 according to another embodiment of the present invention.

That is, as shown in FIG. 6, in state of floating the bit lines (BL1, BL2, BL3, BL4) and the semiconductor substrate 11 at the side of the logic circuit, for example, a common source driving circuit, the word line driving circuit 101, and the bit line driving circuit 102, a negative (−) voltage is applied to the word lines (WL1, WL2, WL3, WL4), and a positive (+) voltage or a ground voltage is applied to the common line.

Under these bias-conditions, a strong electric field is smoothly formed from the source diffusion layer 18 toward the control gate pattern 17 in each memory cell (MC). As applying the strong electric field, the electrons kept in the potential well of the floating gate pattern 14 are discharged to the source diffusion layer 18 by F—N tunneling the tunnel oxide layer 13. Thus, the threshold voltage in each memory cell (MC) decreases.

In this case, since the first and second block oxide layers 15 and 16 are positioned above the floating gate pattern 14, the electrons of the control gate pattern 17 are induced to the floating gate pattern 15 by modified tunneling in the latter half of the cell erasing operation by the logic circuit. Thus, even though the electrons of the floating gate pattern 14 are considerably discharged to the source diffusion layer 18, it is compensated with some electrons of the control gate pattern 17, thereby preventing the excessive electron erasing phenomenon in each memory cell (MC).

Figure 7:
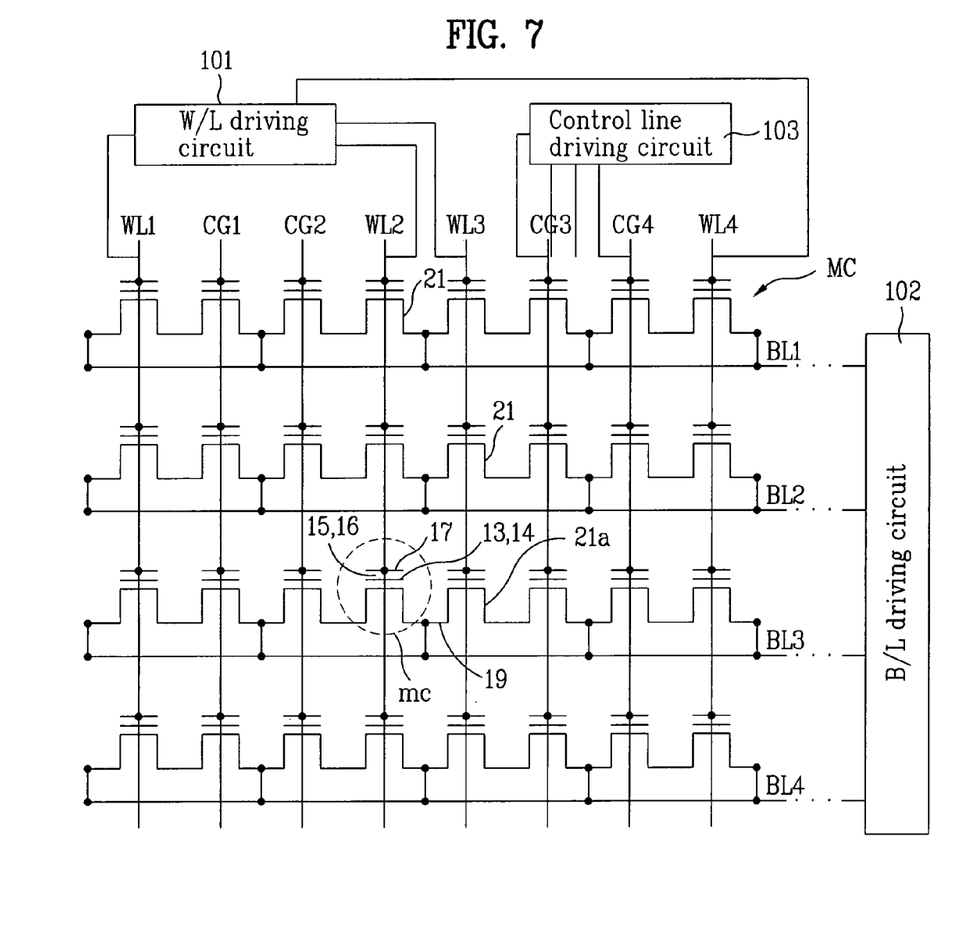
FIG. 7 is a circuit diagram of a non-volatile memory device according to the second embodiment of the present invention.
Figure 8:
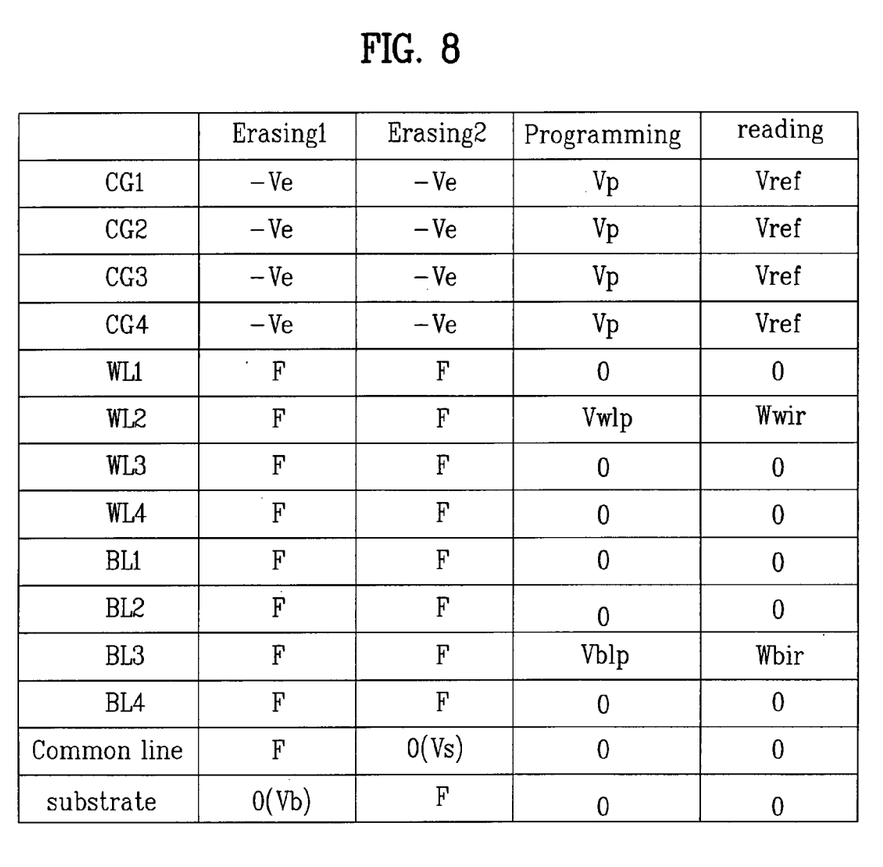
FIG. 8 is a table for showing the driving conditions of a non-volatile memory device according to the second embodiment of the present invention.
Figure 9:
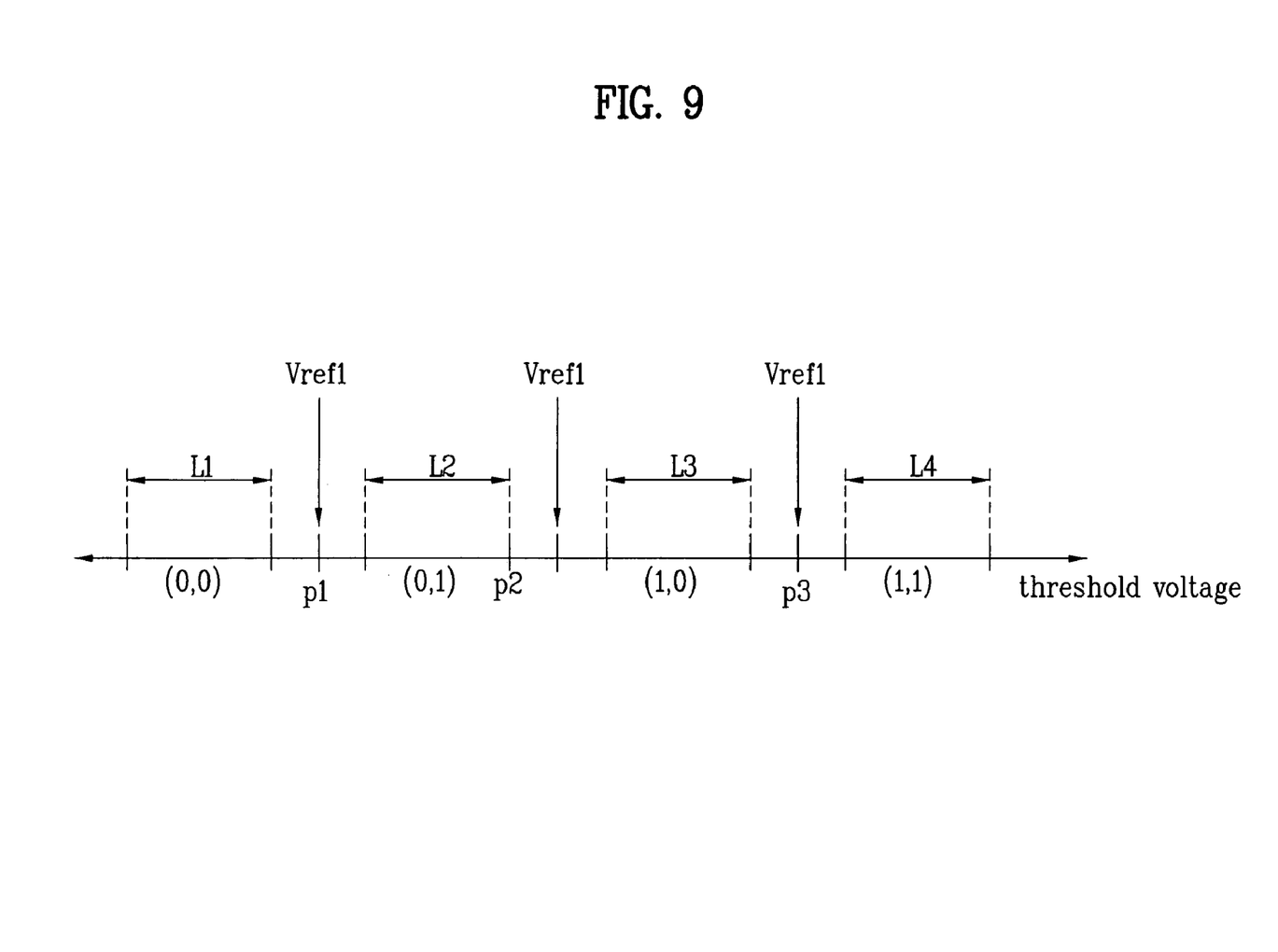
FIG. 9 is an exemplary view for showing a programming time according to the kind of data stored in a non-volatile memory device according to the second embodiment of the present invention.

FIG. 7 is a circuit diagram of a non-volatile memory device according to the second embodiment of the present invention. FIG. 8 is a table of showing the driving conditions of a non-volatile memory device according to the second embodiment of the present invention. FIG. 9 is an exemplary view of showing a programming time according to the kind of data stored in a non-volatile memory device according to the second embodiment of the present invention.

As shown in FIG. 7, the non-volatile memory device according to the second embodiment of the present invention includes a plurality of non-volatile memory cells (MC) arranged in a matrix type, a select transistor 21 for selectively driving the non-volatile memory cells (MC), a plurality of word lines (WL1, WL2, WL3, . . . ) for applying a select signal to the select transistor to selectively drive the non-volatile memory cells (MC), a plurality of control lines (CG1, CG2, CG3, . . . ) for applying a control signal to a control gate pattern of the non-volatile memory cell (MC), a plurality of bit lines (BL1, BL2, BL3, . . . ) for applying a signal to a drain diffusion layer of the non-volatile memory cell (MC), a word line driving circuit 101 for driving the plurality of word lines (WL1, WL2, WL3, . . . ), a bit line driving circuit 102 for driving the bit lines (BL1, BL2, BL3, . . . ), and a control line driving circuit 103 for driving the control line.

As described in FIG. 3, each of the memory cells (MC) is comprised of a tunnel oxide layer pattern 13, a floating gate pattern 14, a first block oxide layer pattern 15, a second block oxide layer pattern 16, a control gate pattern 17, and source/drain diffusion layers 18/19. At this time, the tunnel oxide layer pattern 13 is formed on a semiconductor substrate 11, and the floating gate pattern 14 is formed on the tunnel oxide layer pattern 13. Then, the first block oxide layer pattern 15 is formed on the floating gate 14, and the second block oxide layer pattern 16 is formed on the first block oxide layer pattern 15. Also, the control gate pattern 17 is formed on the second block oxide layer pattern 16, and the source/drain diffusion layers 18/19 are formed in the semiconductor substrate 11 at both sides of the floating gate pattern 14.

In addition, the respective control gate patterns 17 of the memory cells (MC) arranged along each vertical line are connected to one control line (CG1, CG2, or CG3, . . . ), and respective gates of the select transistors 21 arranged along each vertical line are connected to one word line (WL1, WL2, WL3, or WL4, . . . ). Also, the respective drain diffusion layers 19 of the memory cells (MC) arranged along each horizontal line are connected to one bit line (BL1, BL2, BL3, or BL4, . . . ), and the respective source diffusion layers 18 of the memory cells (MC) are connected to the common line (not shown).

A driving method of the non-volatile memory device according to the second embodiment of the present invention will be described in detail.

First, an erasing method will be described as follows.

To discharge the electrons injected to the floating gate pattern 14 in each memory cell (MC) to the semiconductor substrate 11, as shown in FIG. 8, the bit lines (BL1, BL2, BL3, BL4, . . . ), the word lines (WL1, WL2, WL3, WL4, . . . ) and the common lines are floated, a negative (−) voltage is applied to the control lines (CG1, CG2, CG3, CG4, . . . ), and a ground voltage 0V or a positive (+) voltage (Vb) is applied to the semiconductor substrate 11.

On applying the voltages, a strong electric field is formed from the semiconductor substrate 11 toward the control gate pattern 17 of the memory cell (MC). As applying the strong electric field, the electrons kept in a potential well of the floating gate pattern 14 are discharged to the semiconductor substrate 11 by F-N tunneling the tunnel oxide layer 13. Thus, the threshold voltage in each memory cell (MC) decreases.

In this state, since the first and second block oxide layers 15 and 16 are positioned between each floating gate pattern 14 and the control gate pattern 17, the electrons of the control gate pattern 17 are induced to the floating gate pattern 14 by modified tunneling at the latter half of the erasing operation. Accordingly, even though the electrons of the floating gate pattern 14 are considerably discharged to the semiconductor substrate 11, it is compensated with some electrons of the control gate pattern 17, thereby preventing the excessive electron erasing phenomenon in each memory cell (MC).

A programming method for injecting the electrons to the memory cell (MC) for programming will be described as follows.

That is, a positive (+) voltage is applied to the corresponding word line WL2 of the memory cell for programming, and a ground voltage 0V is applied to the remaining word lines. Then, a positive (+) voltage is applied to the corresponding bit line BL3 of the selected memory cell (MC), and a ground voltage 0V is applied to the remaining bit lines (BL1, BL2, BL4). Also, a ground voltage 0V is applied to the common line and the semiconductor substrate 11, and a positive (+) voltage is applied to the control lines (CG1, CG2, CG3, CG4).

As the select transistor 21a is selected by the word line WL1 and the bit line BLC to which the positive (+) voltage is applied, only the select transistor 21 is turned on. Thus, in case of the selected memory cell (MC), the voltage is simultaneously applied to the drain diffusion layer 19 and the control gate pattern 17. As a result, a channel is formed between the source diffusion layer 18 and the drain diffusion layer 19 of the selected memory cell (MC), so that a current flows from the drain diffusion layer 19 to the source diffusion layer 18. Then, hot carriers generate at a corner of the flowing gate pattern 14 overlapped with the source diffusion layer 18, and some electrons are injected to the floating gate pattern 14 by hot-electron injection effect. At this time, the voltage applied to the control line CG, the word line WL2 and the bit line BL3 is determined in due consideration of hot-electron injection effect, break-down of the drain diffusion layer 19, flow of current, and diffusion coefficient of electrons.

At this time, under the aforementioned conditions, a time period of applying the voltage to each of the word line, the bit line, and the control line is controlled according to the kind of methods for storing predetermined data.

That is, as shown in FIG. 9, in case of programming the data (0,0) to the floating gate pattern 14 of the selected memory cell (MC), it is necessary to shorten a time period L1 for applying the voltage to the word line, the bit line, and the control line, whereby the electrons are injected to the floating gate pattern 14 of the selected memory cell (MC) within a range of a programming threshold voltage.

In case of programming the data (0,1) to the floating gate pattern 14 of the selected memory cell (MC), it is necessary to set a time period L2 longer than the first time period L1, the time period L2 for applying the voltage to the word line the bit line, and the control line, whereby the electrons are injected to the floating gate pattern 14 of the selected memory cell (MC) within a range of a programming threshold voltage.

Also, in case of programming the data (1,0) to the floating gate pattern 14 of the selected memory cell (MC), it is necessary to set a time period L3 longer than the second time period L2, the time period L3 for applying the voltage to the word line, the bit line, and the control line, whereby the electrons are injected to the floating gate pattern 14 of the selected memory cell (MC) within a range of a programming threshold voltage.

In case of programming the data (1,1) to the floating gate pattern 14 of the selected memory cell (MC), it is necessary to set a fourth time period L4 longer than the time period L3, the time period L4 for applying the voltage to the word line, the bit line, and the control line, whereby the electrons are injected to the floating gate pattern 14 of the selected memory cell (MC) within a range of a programming threshold voltage.

Meanwhile, in state of completing the programming process under the aforementioned bias-conditions, a reading step is performed to read the programming state of the selected memory cell (MC).

That is, a reference voltage is applied to all of the control lines, a positive (+) voltage is applied to the corresponding word line WL2 of the memory cell (MC) for reading the programming state, and a ground voltage is applied to the remaining word lines. Then, a positive (+) voltage is applied to the corresponding bit line BL3 of the selected memory cell (MC), a ground voltage is applied to the remaining bit lines, and a ground voltage is applied to the common line and the semiconductor substrate 11.

Accordingly, the corresponding memory cell (MC) can read the data according to the erasing state or the programming state. That is, as described above, in case of the erasing state, the memory cell (MC) has the low threshold voltage. Meanwhile, in case of the programming state, the memory cell (MC) has the high threshold voltage. Thus, if the positive (+) voltage is applied to the word line of the selected memory cell, the corresponding select transistor is turned-on. Also, if the selected memory cell is in the erasing state (if the threshold voltage is lower than the reference voltage applied by the control line), the channel is formed between the source diffusion layer 18 and the drain diffusion layer 19. Also, if the selected memory cell is in the programming state (if the threshold voltage is higher than the reference voltage applied by the control line), the channel is not formed between the source diffusion layer 18 and the drain diffusion layer 19 even though the corresponding select transistor is turned-on. In this way, it is possible to read the data storing state in each memory cell (MC) by using the current flow mechanism in each memory cell.

At this time, as shown in FIG. 9, when the reference voltage is applied to the control lines (CG1, CG2, CG3, CG4), the reference voltage having the different values are applied several times to the control lines (CG1, CG2, CG3, CG4), so that it is possible to detect whether the selected memory cell (MC) stores which data of (0,0), (0,1), (1,0), and (1,1).

First, the reference voltage applied to the control line of the selected memory cell (MC) is determined as an intermediate value (p1) between the highest threshold voltage (L1) and in the range L1 and the lowest threshold voltage in the range L2, thereby detecting the kind of data stored in the selected memory cell (MC). That is, if the current flows to the source diffusion layer 18 of the selected memory cell (MC), it is determined as the selected memory cell (MC) stores the data of (0,0).

If the current doesn't flow to the source diffusion layer 18 of the selected memory cell (MC) by applying the reference voltage, determined as the intermediate value between the highest threshold voltage in the range L1 and the lowest threshold voltage in the range L2, to the control line, there is requirement for determining the reference voltage as an intermediate value (p2) between the highest threshold voltage in the range L2 and the lowest threshold voltage in the range L3, and applying the reference voltage to the control line. In this state, if the current flows to the source diffusion layer 18 of the selected memory cell (MC), it is determined as the selected memory cell (MC) stores the data of (0,1).

If the current doesn't flow to the source diffusion layer 18 of the selected memory cell (MC) by applying the reference voltage, determined as the intermediate value (p2) between the highest threshold voltage in the range L2 and the lowest threshold voltage in the range L3, to the control line, there is requirement for determining the reference voltage as an intermediate value (p3) between the highest threshold voltage in the range L3 and the lowest threshold voltage in the range L4, and applying the reference voltage to the control line. In this state, if the current flows to the source diffusion layer 18 of the selected memory cell (MC), it is determined as the selected memory cell (MC) stores the data of (1,0).

If the current doesn't flow to the source diffusion layer 18 of the selected memory cell (MC) by applying the reference voltage, determined as the intermediate value (p3) between the highest threshold voltage in the range L3 and the lowest threshold voltage in the range L4, to the control line, it is determined as the selected memory cell (MC) stores the data of (1,1).

Eventually, the non-volatile memory cell may be driven and operated as a multi-bit memory with easiness, according to the aforementioned erasing, programming and reading steps.

Meanwhile, on the erasing process, the electrons injected to the floating gate pattern 14 are discharged to the semiconductor substrate 11. However, the electrons injected to the floating gate pattern 14 may be discharged to the source diffusion layer 18 according to another embodiment of the present invention. That is, in state of floating the bit lines (BL1, BL2, BL3, BL4), the word lines (WL1, WL2, WL3, WL4), and the semiconductor substrate 11, a negative (−) voltage is applied to the control lines (CG 1, CG2, CG3, CG4), and a ground voltage 0V or a positive (+) voltage (Vb) is applied to the common line.

In this case, a strong electric filed is formed from the source diffusion layer 18 to the control gate pattern 17 in each memory cell (MC). By the strong electric field, the electrons kept in a potential well of the floating gate pattern 14 are discharged to the source diffusion layer 18 by F-N tunneling the tunnel oxide layer 13. Thus, the threshold voltage in each memory cell (MC) decreases.

In this state, since the first and second block oxide layers 15 and 16 are positioned above each floating gate pattern 14, the electrons of the control gate pattern 17 are induced to the floating gate pattern 14 by modified tunneling at the latter half of the erasing operation. Accordingly, even though the electrons of the floating gate pattern 14 are considerably discharged to the source diffusion layer 18, it is compensated with some electrons of the control gate pattern 17, thereby preventing the excessive electron erasing phenomenon in each memory cell (MC).

As mentioned above, the non-volatile memory device and the method for driving the same have the following advantages.

First, the first and second block oxide layers are positioned between the floating gate pattern and the control gate pattern, whereby the electrons of the control gate pattern are induced to the floating gate pattern by modified tunneling at the latter half of the erasing operation. Accordingly, on the erasing operation, even though the electrons of the floating gate pattern are considerably discharged to the semiconductor substrate, it is compensated with some electrons of the control gate pattern, thereby preventing the excessive electron erasing phenomenon in each memory cell (MC).

Also, the erasing bias-condition, the programming-bias condition and the reading bias-condition for the non-volatile memory device are given in detail, whereby the non-volatile memory device is stably driven and operated.

In addition, the erasing bias-condition, the programming-bias condition and the reading bias-condition for storing multi-level data to the unit memory cell and reading the multi-level data are given in detail, so that the non-volatile memory device is driven and operated for the multi-level data.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for driving a non-volatile memory device including a plurality of word lines, a plurality of bit lines, and a plurality of memory cells, wherein each memory cell includes a tunnel oxide layer, a floating gate pattern, a control gate pattern connected with the word line, first and second block oxide layers formed between the floating gate pattern and the control gate pattern, and first and second impurity diffusion layers formed in a semiconductor substrate at both sides of the floating gate pattern and connected with a common line and the bit line, comprising:

floating the bit lines and the common line, applying a negative (−) voltage to the word lines, and applying a first voltage to the semiconductor substrate, to erase electrons injected to the floating gate patterns to the semiconductor substrate, and to induce some of electrons stored in the control gate patterns to the floating gate patterns by modified tunneling;

applying a positive (+) voltage to the word line and the bit line of the selected memory cell, and applying a second voltage to the remaining word lines and bit lines, the common line and the semiconductor substrate, to program the electrons in the selected memory cell; and applying a reference voltage to the word line of the selected memory cell, applying a second positive voltage to the bit line of the selected memory cell, and applying the second voltage to the remaining word lines and bit lines, the common line and the semiconductor substrate, to read a program state of the selected memory cell.

2. The method of claim 1, wherein the first voltage is a ground voltage or a positive voltage.

3. The method of claim 1, wherein the second voltage is a ground voltage.

4. The method of claim 1, wherein the reference voltage is determined as a value between the highest erasing threshold voltage and the lowest programming threshold voltage in each memory cell.

5. A method for driving a non-volatile memory device including a plurality of word lines, a plurality of bit lines, and a plurality of memory cells, wherein each memory cell includes a tunnel oxide layer, a floating gate pattern, a control gate pattern connected with the word line, first and second block oxide layers formed between the floating gate pattern and the control gate pattern, and first and second impurity diffusion layers formed in a semiconductor substrate at both sides of the floating gate pattern and connected with a common line and the bit line, comprising:

floating the bit lines and the semiconductor substrate, applying a negative (−) voltage to the word lines, and applying a first voltage to the common line, to erase electrons injected to the floating gate patterns to the first impurity diffusion layer, and to induce electrons stored in the control gate patterns to the floating gate patterns by modified tunneling;

applying a positive (+) voltage to the word line and the bit line of the selected memory cell, and applying a second voltage to the remaining word lines and bit lines, the common line and the semiconductor substrate, to program the electrons in the selected memory cell; and applying a reference voltage to the word line of the selected memory cell, applying a second positive voltage to the bit line of the selected memory cell, and applying the second voltage to the remaining word lines and bit lines, the common line and the semiconductor substrate, to read a program state of the selected memory cell.

6. The method of claim 5, wherein the first voltage is a ground voltage or a positive voltage.

7. The method of claim 5, wherein the second voltage is a ground voltage.

8. The method of claim 5, wherein the reference voltage is determined as a value between the highest erasing threshold voltage and the lowest programming threshold voltage in each memory cell.

9. A method for driving a non-volatile memory device including a plurality of word lines, a plurality of control lines, a plurality of bit lines, a plurality of memory cells, and a plurality of select transistors for selecting the memory cell by the plurality of word lines, wherein each memory cell includes a tunnel oxide layer, a floating gate pattern, a control gate pattern connected with the control line, first and second oxide layers formed between the floating gate pattern and the control gate pattern, and first and second impurity diffusion layers formed in a semiconductor substrate at both sides of the floating gate pattern and connected with a common line and the bit line, comprising:

floating the word lines, the bit lines, and the common line, applying a negative (−) voltage to the control lines, and applying a first voltage to the semiconductor substrate, to erase electrons injected to the floating gate pattern to the semiconductor substrate, and to induce some electrons stored in the control gate patterns to the floating gate patterns by modified tunneling;

applying a positive voltage to the word line and the bit line of the selected memory cell, applying a second voltage to the remaining word lines and bit lines the common line, and the semiconductor substrate, and applying a second positive voltage to the control lines, to program the electrons in the selected memory cell; and applying a reference voltage to the control lines, applying a third positive voltage to the word line and the bit line of the selected memory cell, and applying the second voltage to the remaining word lines and bit lines, the common line and the semiconductor substrate, to read a program state of the selected memory cell.

10. The method of claim 9, wherein, on programming the electrons in the selected memory cell, time periods for applying the voltages to the word line, the bit line, and the control line are selectively and variably controlled according to the kind of data stored in each line.

11. The method of claim 10, wherein the time periods satisfy the order of L1<L2<L3<L4, in which L1 is a time for applying the voltage of the same condition in the stored data of (0,0), L2 is a time for applying the voltage of the same condition in the stored data of (0,1), L3 is a time for applying the voltage of the same condition in the stored data of (1,0), and L4 is a time for applying the voltage of the same condition in the stored data (1,1).

12. The method of claim 10, on reading the program state of the selected memory cell, the reference voltage applied to the control lines is differently and variably applied several times to read the data stored in the memory cell.

13. The method of claim 12, wherein the process of reading the program state of the selected memory cell includes:
   a first step of determining that the selected memory cell stores the data of (0,0) when a current flows to the first impurity diffusion layer of the selected memory cell, by applying the reference voltage applied to the control line of the selected memory cell, the reference voltage having an intermediate value between the highest threshold voltage of a first threshold voltage range (L1) and the lowest threshold voltage of a second threshold voltage range (L2);
   a second step of determining that the selected memory cell stores the data of (0,1) when the current flows to the first impurity diffusion layer of the selected memory cell, by applying the reference voltage applied to the control line of the selected memory cell, the reference voltage having an intermediate value between the highest threshold voltage of the second threshold voltage range (L2) and the lowest threshold voltage of a third threshold voltage range (L3), if the current doesn't flow to the first impurity diffusion layer of the selected memory cell in the first step;
   a third step of determining that the selected memory cell stores the data of (1,0) when the current flows to the first impurity diffusion layer of the selected memory cell, by applying the reference voltage applied to the control line of the selected memory cell, the reference voltage having an intermediate value between the highest threshold voltage of the third threshold voltage range (L3) and the lowest threshold voltage of a fourth threshold voltage range (L4), if the current doesn't flow to the first impurity diffusion layer of the selected memory cell in the second step; and
   a fourth step of determining that the selected memory cell stores the data of (1,1) when the current doesn't flows to the first impurity diffusion layer of the selected memory cell, by applying the reference voltage applied to the control line of the selected memory cell, the reference voltage having an intermediate value between the highest threshold voltage of the third threshold voltage range (L3) and the lowest threshold voltage of the fourth threshold voltage range (L4).

14. The method of claim 9, wherein the first voltage is a ground voltage or a positive voltage.

15. The method of claim 9, wherein the second voltage is a ground voltage.

16. A method for driving a non-volatile memory device including a plurality of word lines, a plurality of control lines, a plurality of bit lines, a plurality of memory cells, and a plurality of select transistors for selecting the memory cell by the plurality of word lines, wherein each memory cell includes a tunnel oxide layer, a floating gate pattern, a control gate pattern connected with the control line, first and second oxide layers formed between the floating gate pattern and the control gate pattern, and first and second impurity diffusion layers formed in a semiconductor substrate at both sides of the floating gate pattern and connected with a common line and the bit line, comprising:
   floating the word lines, the bit lines and the semiconductor substrate, applying a negative (−) voltage to the control lines, and applying a first voltage to the common line, to erase electrons injected to the floating gate patterns to the first impurity diffusion layer, and to induce electrons stored in the control gate patterns to the floating gate patterns by modified tunneling;
   applying a positive (+) voltage to the word line and the bit line of the selected memory cell, applying a second voltage to the remaining word lines and bit lines, the common line and the semiconductor substrate, and applying a second positive voltage to the control lines, to program the electrons in the selected memory cell; and
   applying a reference voltage to the control lines, applying a third positive voltage to the word line and the bit line of the selected memory cell, and applying the second voltage to the remaining word lines and bit lines, the common line and the semiconductor substrate, to read a program state of the selected memory cell.

17. The method of claim 16, wherein, on programming the electrons in the selected memory cell, time periods for applying the voltages to the word line, the bit line, and the control line are selectively and variably controlled according to the kind of data stored in each line.

18. The method of claim 17, wherein the time periods satisfy the order of L1<L2<L3<L4, in which L1 is a time for applying the voltage of the same condition in the stored data of (0,0), L2 is a time for applying the voltage of the same condition in the stored data of (0,1), L3 is a time for applying the voltage of the same condition in the stored data of (1,0), and L4 is a time for applying the voltage of the same condition in the stored data (1,1).

19. The method of claim 16, wherein, on reading the program state of the selected memory cell, the reference voltage applied to the control lines is differently and variably applied several times to read the data stored in the memory cell.

20. The method of claim 19, wherein the process of reading the program state of the selected memory cell includes:
   a first step of determining that the selected memory cell stores the data of (0,0) when a current flows to the first impurity diffusion layer of the selected memory cell, by applying the reference voltage applied to the control line of the selected memory cell, the reference voltage having an intermediate value between the highest threshold voltage of a first threshold voltage range (L1) and the lowest threshold voltage of a second threshold voltage range (L2);
   a second step of determining that the selected memory cell stores the data of (0,1) when the current flows to the first impurity diffusion layer of the selected memory cell, by applying the reference voltage applied to the control line of the selected memory cell, the reference voltage having an intermediate value between the highest threshold voltage of the second threshold voltage range (L2) and the lowest threshold voltage of a third threshold voltage range (L3), if the current doesn't flow to the first impurity diffusion layer of the selected memory cell in the first step;
   a third step of determining that the selected memory cell stores the data of (1,0) when the current flows to the first impurity diffusion layer of the selected memory cell, by applying the reference voltage applied to the control line of the selected memory cell, the reference voltage having an intermediate value between the highest threshold voltage of the third threshold voltage range (L3) and the lowest threshold voltage of a fourth threshold voltage range (L4), if the current doesn't flow to the first impurity diffusion layer of the selected memory cell in the second step; and a fourth step of determining that the selected memory cell stores the data of (1,1) when the current doesn't flows to the first impurity diffusion layer of the selected memory cell, by applying the reference voltage applied to the control line of the selected memory cell, the reference voltage having the intermediate value between the highest threshold voltage of the third threshold voltage range (L3) and the lowest threshold voltage of the fourth threshold voltage range (L4).

21. The method of claim 16, wherein the first voltage is a ground voltage or a positive voltage.

22. The method of claim 16, wherein the second voltage is a ground voltage.

* * * * *